(12) United States Patent
Vestweber et al.

(10) Patent No.: US 7,981,522 B2
(45) Date of Patent: Jul. 19, 2011

(54) ORGANIC ELECTROLUMINESCENT ELEMENT

(75) Inventors: Horst Vestweber, Gilserberg-Winterscheid (DE); Anja Gerhard, Veitshöchheim (DE); Philipp Stößel, Frankfurt (DE)

(73) Assignee: Merck Patent GmbH, Darmstadt (DE)

( * ) Notice: Subject to any disclaimer, the term of this patent is extended or adjusted under 35 U.S.C. 154(b) by 1079 days.

(21) Appl. No.: 10/581,005

(22) PCT Filed: Nov. 24, 2004

(86) PCT No.: PCT/EP2004/013312
§ 371 (c)(1),
(2), (4) Date: May 26, 2006

(87) PCT Pub. No.: WO2005/054403
PCT Pub. Date: Jun. 16, 2005

(65) Prior Publication Data
US 2007/0134510 A1    Jun. 14, 2007

(30) Foreign Application Priority Data
Dec. 5, 2003 (DE) .................. 103 57 315

(51) Int. Cl.
H01L 51/54 (2006.01)
(52) U.S. Cl. .......... 428/690; 428/917; 313/504
(58) Field of Classification Search .......... None
See application file for complete search history.

(56) References Cited

U.S. PATENT DOCUMENTS

| | | | |
|---|---|---|---|
| 5,840,217 A | 11/1998 | Lupo et al. | |
| 7,683,229 B2 * | 3/2010 | Stoessel et al. | 585/471 |
| 2002/0015859 A1 | 2/2002 | Watanabe et al. | |
| 2002/0034656 A1 | 3/2002 | Thompson et al. | |
| 2002/0066904 A1 * | 6/2002 | Yuan et al. | 257/83 |
| 2002/0125818 A1 | 9/2002 | Sato et al. | |
| 2002/0182441 A1 * | 12/2002 | Lamansky et al. | 428/690 |
| 2003/0022019 A1 | 1/2003 | Seo et al. | |
| 2003/0168970 A1 * | 9/2003 | Tominaga et al. | 313/504 |
| 2004/0077862 A1 | 4/2004 | Stossel et al. | |
| 2005/0234240 A1 | 10/2005 | Stossel et al. | |
| 2006/0208221 A1 * | 9/2006 | Gerhard et al. | 252/301.16 |
| 2006/0220004 A1 * | 10/2006 | Stossel et al. | 257/40 |

FOREIGN PATENT DOCUMENTS

| | | |
|---|---|---|
| DE | 103 30 761 | 2/2005 |
| EP | 0 676 461 | 10/1995 |
| EP | 1 191 612 | 3/2002 |
| EP | 1 191 613 | 3/2002 |
| EP | 1 191 614 | 3/2002 |
| EP | 1 202 358 | 5/2002 |
| EP | 1 353 388 | 10/2003 |
| JP | 10-231479 | 9/1998 |
| JP | 2002-260863 A | 9/2002 |
| JP | 2003-259818 A | 9/2003 |
| JP | 2003-317965 A | 11/2003 |
| JP | 2004-220931 * | 8/2004 |
| WO | WO-98/01011 | 1/1998 |
| WO | WO-99/40051 | 8/1999 |
| WO | WO-00/57676 | 9/2000 |
| WO | WO-00/70655 | 11/2000 |
| WO | WO-01/41512 | 6/2001 |
| WO | WO-02/02714 | 1/2002 |
| WO | WO-02/15645 | 2/2002 |
| WO | WO-02/43449 A1 | 5/2002 |
| WO | WO-02/060910 | 8/2002 |
| WO | WO-02/074015 | 9/2002 |
| WO | WO-03/040257 | 5/2003 |
| WO | WO-03/084972 | 10/2003 |
| WO | WO-2004/026886 | 4/2004 |
| WO | WO-2004/081017 | 9/2004 |
| WO | WO-2004/093207 | 10/2004 |
| WO | WO 2010098386 * | 9/2010 |

OTHER PUBLICATIONS

Burgi et. al., From Crystal Statics to Chemical . . . 1983, J. Am. Chem. Soc. vol. 16,, pp. 153-161.*
Salbeck et al., "Low molecular organic glasses for blue electroluminescence," *Synthetic Metals*, 1997, pp. 209-215, vol. 91.
Tokito et al., "Influence of hole transporting material on device performance in organic light-emitting diode," *Thin Solid Films*, 2000, pp. 290-293, vol. 363.
Spreitzer et al., "White and Blue Temperature Stabile and Efficient OLEDs using amorphous Spiro Transport and Spiro Emitting Compounds," *Proceedings of SPIE*, 2001, pp. 125-133, vol. 4105.
Japanese Office Action dated Jan. 25, 2011 in Japanese Pat. Appln. No. 2006-541841.

* cited by examiner

*Primary Examiner* — D. Lawrence Tarazano
*Assistant Examiner* — Gregory Clark
(74) *Attorney, Agent, or Firm* — Connolly Bove Lodge & Hutz LLP

(57) ABSTRACT

The invention relates to the improvement of phosphorescent organic electroluminescent devices, by the use of materials of formulas (1) to (4), as indicated in diagram 1, in the hole blocking layer.

25 Claims, No Drawings

ORGANIC ELECTROLUMINESCENT ELEMENT

RELATED APPLICATIONS

This application is a national stage application (under 35 U.S.C. 371) of PCT/EP2004/013312 filed Nov.24, 2004, which claims benefit to German application 103 57 315.1 filed Dec.5, 2003.

The present invention describes a novel design principle for organic electroluminescent elements and the use thereof in displays based thereon.

In a number of different applications which can be ascribed to the electronics industry in the broadest sense, the use of organic semiconductors as functional materials has been reality for some time or is expected in the near future. Thus, light-sensitive organic materials (for example phthalocyanines) and organic charge-transport materials (generally hole transporters based on triarylamine) have already been used for many years in photocopiers. The use of semiconducting organic compounds which are capable of the emission of light in the visible spectral region is just at the beginning of the market introduction, for example in organic electroluminescent devices. The individual components thereof, the organic light-emitting diodes (OLEDs), have a very broad range of applications as:
1. white or coloured backlighting for monochromatic or multicoloured display elements (such as, for example, in calculators, mobile telephones, etc.),
2. large-area displays (such as, for example, traffic signs, placards, etc.),
3. illumination elements in all colours and shapes,
4. monochromatic or full-colour passive matrix displays for portable applications (such as, for example, mobile telephones, PDAs, camcorders, etc.),
5. full-colour, large-area, high-resolution active matrix displays for a very wide variety of applications (such as, for example, mobile telephones, PDAs, laptops, TVs, etc.).

For devices containing relatively simple OLEDs, the market introduction has already taken place, as confirmed by the car radios from Pioneer, the mobile telephones from Pioneer and SNMD or a digital camera from Kodak with an "organic display". Further products of this type are just about to be introduced. Nevertheless, significant improvements are still necessary here in order to make these displays a true competitor to the liquid-crystal displays (LCDs) which currently dominate the market, or to surpass them.

A development in this respect which has emerged in recent years is the use of organo-metallic complexes which exhibit phosphorescence instead of fluorescence (M. A. Baldo, S. Lamansky, P. E. Burrows, M. E. Thompson, S. R. Forrest, *AppL. Phys. Lett.*, 1999, 75, 4-6).

For quantum-mechanical reasons, an up to four-fold quantum, energy and power efficiency is possible using organometallic compounds. Whether this new development will become established is on the one hand highly dependent on whether corresponding device compositions are found which are also able to implement these advantages (triplet emission=phosphorescence compared with singlet emission=fluorescence) in the OLEDs. It is not only the development of the organometallic compounds themselves that is of importance here, but also, in particular, of further materials specifically required for this purpose, such as, for example, so-called matrix or also hole-blocking materials. Essential conditions that may be mentioned here for practical use are, in particular, a long operating lifetime, high stability to thermal stresses and a low use and operating voltage together with high power efficiency, in order to facilitate mobile applications.

An organic electroluminescent device usually consists of a plurality of layers which are applied to one another by means of vacuum methods or various printing methods. For phosphorescent organic electroluminescent devices, these layers are in detail:
1. A support plate=substrate (usually glass or plastic sheet).
2. A transparent anode (usually indium-tin oxide, ITO).
3. A hole-injection layer (HIL): for example based on copper phthalocyanine (CuPc) or conductive polymers, such as polyaniline (PANI) or polythiophene derivatives (such as PEDOT).
4. One or more hole-transport layers (HTL): usually based on triarylamine derivatives, for example 4,4',4''-tris(N-1-naphthyl)-N-phenylamino)triphenylamine (NaphDATA) as the first layer and N,N'-di(naphth-1-yl)-N,N'-diphenylbenzidine (NPB) as the second hole-transport layer.
5. One or more emission layers (EML): usually comprising matrix materials, such as, for example, 4,4'-bis(carbazol-9-yl)biphenyl (CBP), doped with phosphorescent dyes, for example tris(phenylpyridyl)iridium ($Ir(PPy)_3$) or tris(2-benzothienylpyridyl)iridium ($Ir(BTP)_3$). However, the emission layer may also consist of polymers, mixtures of polymers, mixtures of polymers and low-molecular-weight compounds or mixtures of various low-molecular-weight compounds.
6. A hole-blocking layer (HBL): usually comprising BCP (2,9-dimethyl-4,7-diphenyl-1,10-phenanthroline=bathocuproin) or bis(2-methyl-8-quinolinolato)-4-(phenylphenolato)-aluminium(III) (BAlq).
7. An electron-transport layer (ETL): usually based on aluminium tris-8-hydroxyquinolinate ($AlQ_3$).
8. An electron-injection layer (EIL) (also known as insulator layer (ISL)): thin layer consisting of a material having a high dielectric constant, such as, for example, LiF, $Li_2O$, $BaF_2$, MgO, NaF.
9. A cathode: generally metals, metal combinations or metal alloys with a low work function, for example Ca, Ba, Cs, Mg, Al, In, Mg/Ag.

This device is appropriately (depending on the application) structured, provided with contacts and finally also hermetically sealed, since the lifetime of such devices is generally drastically shortened in the presence of water and/or air. The same also applies to so-called inverted structures, in which the light is coupled out of the cathode. In these inverted OLEDs, the anode consists, for example, of Al/Ni/NiOx or Al/Pt/PtOx or other metal/metal oxide combinations which have a highest occupied molecular orbital (HOMO) having an energy of greater than 5 eV. The cathode here consists of the same materials described in points 9 and 10, with the difference that the metal is very thin and thus transparent. The layer thickness is less than 50 nm, better less than 30 nm, still better less than 10 nm. A further transparent material, for example ITO (indium-tin oxide), IZO (indium-zinc oxide), etc., can also be applied to this transparent cathode.

Depending on the device structure, a plurality of these layers may also coincide or each of these layers does not necessarily have to be present.

However, there are still considerable problems which require urgent improvement:
1. For example, in particular, the operating lifetime of OLEDs is still short, meaning that it has hitherto only been possible to implement simple applications commercially.
2. This relatively short lifetime gives rise to a secondary problem: especially for full-colour applications ("full-colour displays"), i.e. displays which have no segmentation, but instead are able to display all colours over the entire area, it is particularly unfavourable if the individual colours age at different rates here, as is currently the case. This results in the white point shifting significantly before the end of the above-mentioned lifetime (which is generally defined by a drop to 50% of the initial brightness), i.e. the colour fidelity of the representation in the display becomes very poor. In order to circumvent this some display manufacturers define the lifetime as 70% or 90% lifetime (i.e. drop in the initial brightness to 70% or to 90% of the initial value). However, this results in the lifetime becoming even shorter.

3. Although the efficiencies, in particular the power efficiency (measured in lm/W), of OLEDs are acceptable, improvements are still also desired here-especially for portable applications.
4. The colour coordinates of OLEDs are not good enough. In particular, the combination of good colour coordinates with high efficiency still has to be improved.
5. The ageing processes are generally accompanied by an increase in the voltage. This effect makes voltage-driven organic electroluminescent devices difficult or impossible. However, current-driven addressing is more complex and expensive in this very case.
6. Precisely in the case of efficient phosphorescent OLEDs, the requisite operating voltage is quite high and therefore has to be reduced further in order to improve the power efficiency. This is of major importance, especially for portable applications.
7. The requisite operating current has likewise been reduced in recent years, but still has to be reduced further in order to improve the power efficiency. This is particularly important especially for portable applications.
8. The structure of the OLEDs is complex and expensive due to the multiplicity of organic layers.

The above-mentioned problems make improvements in the production of OLEDs necessary. In particular, improvements in the area of the matrix and hole-blocking materials are of major importance here.

In phosphorescent OLEDs, a hole-blocking layer (HBL) is usually used after the emitter layer in order to increase the efficiency and lifetime. These device structures are usually optimised in accordance with the criterion of maximum efficiency. BCP (bathocuproin) is frequently used here as hole-blocking material (HBM), with which very good efficiencies are achieved (D. F. O'Brien et al., *Appl. Phys. Lett.* 1999, 74, 442), but with the major disadvantage that the lifetime of the OLEDs comprising BCP is greatly restricted. T. Tsutsui et al. (*Japanese J. Appl. Phys.* 1999, 38, L1502) indicate, as the reason for the restricted lifetime, the low stability of BCP, meaning that these devices cannot be used in high-quality display applications. A further hole-blocking material is bis (2-methyl-8-hydroxyquinolato)(4-phenyl-phenolato)aluminium(III) (BAlq). It has enabled the stability and the lifetime of the devices to be significantly improved, but with the disadvantage that the quantum efficiency of the devices comprising BAlq is significantly (about 40%) lower than with BCP (T. Watanabe et al., *Proc. SPIE* 2001, 4105, 175). Kwong et al. (*Appl. Phys. Lett.* 2002, 81, 162) thus achieved lifetimes of 10,000 h with tris(phenylpyridyl)iridium(III). However, this device exhibited an efficiency of only 19 cd/A, which is well behind the prior art. Thus, although good lifetimes are possible with BAlq, it is overall not a satisfactory hole-blocking material since the efficiency achieved is too low.

As is also evident from the above-described structure of a phosphorescent OLED, this is very complex since a large number of layers, which in turn consist of many different materials, have to be applied one after the other, which makes the production process of commercial OLEDs very complicated and complex.

It is clearly evident from this description that the hole-blocking materials (HBMs) BCP and BAlq in accordance with the prior art used to date result in unsatisfactory side effects. There thus continues to be a demand for hole-blocking materials which result in good efficiencies, but at the same time also in long lifetimes, in OLEDs. Surprisingly, it has now been found that OLEDs which comprise certain classes of material—indicated below—as hole-blocking materials have significant improvements over the prior art. Using these classes of material, it is possible simultaneously to obtain high efficiencies and good lifetimes, which is not possible using materials in accordance with the prior art. In addition, it has been found that a separate electron-transport layer does not necessarily have to be used with the novel hole-blocking materials, which represents a technological advantage, and that consequently the operating voltages can additionally be significantly reduced, which corresponds to higher power efficiency.

The invention relates to an organic electroluminescent device comprising anode, cathode and at least one emission layer comprising at least one matrix material A which is doped with at least one phosphorescent emitter, and at least one hole-blocking layer comprising at least one hole-blocking material B, characterised in that the hole-blocking material B contains at least one chemical structural unit of the formula Y=X, where X has at least one non-bonding electron pair and where the radical X stands for NR, O, S, Se or Te, and R stands for an organic radical having 1 to 22 carbon atoms or for OH, OR, $NH_2$, $NHR^6$ or $N(R^6)_2$, where $R^6$=H or an organic radical having 1 to 20 C atoms, and where the radical Y stands for C, P, As, Sb, Bi, S, Se or Te, with the proviso that the matrix material A is not identical with the hole-blocking material B.

Although evident from the above, it should again explicitly be pointed out here that A and B may contain the same structural unit Y=X, but are otherwise different.

The symbol "=" used above and below stands for a double bond in the sense of the Lewis notation.

Preference is given to an organic electroluminescent device which is characterised in that it comprises a hole-blocking material B conforming to the formulae (1) to (4) according to scheme 1

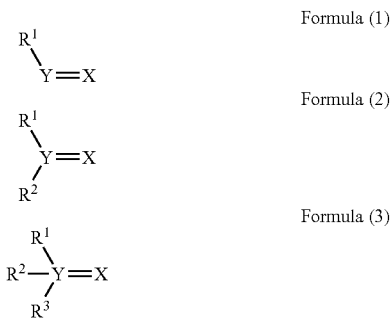

-continued

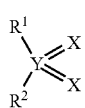

Formula (4)

where the symbols used have the following meaning:

Y is, identically or differently on each occurrence, C in the formula (2) and P, As, Sb or Bi in the formulae (1) and (3) and S, Se or Te in the formulae (2) and (4);

X is on each occurrence, identically or differently, $NR^4$, O, S, Se or Te;

$R^1$, $R^2$, $R^3$ is on each occurrence, identically or differently, H, F, CN, $N(R^4)_2$, a straight-chain, branched or cyclic alkyl, alkoxy or thioalkoxy group having 1 to 40 C atoms, which may be substituted by $R^5$ or also unsubstituted, in which one or more non-adjacent $CH_2$ groups may be replaced by $-R^6C=CR^6-$, $-C\equiv C-$, $Si(R^6)_2$, $Ge(R^6)_2$, $Sn(R^6)_2$, C=O, C=S, C=Se, C=$NR^6$, $-O-$, $-S-$, $-NR^6-$ or $-CONR^6-$ and in which one or more H atoms may be replaced by F, Cl, Br, I, CN or $NO_2$, or an aromatic or heteroaromatic ring system or an aryloxy or heteroaryloxy group having 1 to 40 aromatic C atoms, which may be substituted by one or more radicals $R^5$; a plurality of substituents $R^1$, $R^2$ and/or $R^3$ here may form a mono-or polycyclic, aliphatic or aromatic ring system with one another; or an aromatic or heteroaromatic ring system bonded via a divalent group $-Z-$, or an aryloxy or heteroaryloxy group, each having 1 to 40 aromatic C atoms, in which one or more H atoms may be replaced by F, Cl, Br or I or which may be substituted by one or more non-aromatic radicals $R^4$, where a plurality of substituents $R^4$ may define a further mono-or polycyclic, aliphatic or aromatic ring system;

$R^4$ is on each occurrence, identically or differently, a straight-chain, branched or cyclic alkyl or alkoxy chain having 1 to 22 C atoms, in which, in addition, one or more non-adjacent C atoms may be replaced by $-R^6C=CR^6-$, $-C\equiv C-$, $Si(R^6)_2$, $Ge(R^6)_2$, $Sn(R^6)_2$, $-NR^6-$, $-O-$, $-S-$, $-CO-O-$ or $-O-CO-O-$ and in which one or more H atoms may be replaced by fluorine, an aryl, heteroaryl or aryloxy group having 1 to 40 C atoms, which may also be substituted by one or more radicals $R^6$, or OH or $N(R^5)_2$;

$R^5$ is on each occurrence, identically or differently, $R^4$ or CN, $B(R^6)_2$ or $Si(R^6)_3$;

$R^6$ is on each occurrence, identically or differently, H or an aliphatic or aromatic hydrocarbon radical having 1 to 20 C atoms;

Z is a straight-chain, branched or cyclic, preferably conjugated radical having 1 to 40 C atoms, which is preferably conjugated with the two other substituents, where the number of atoms of Z which link the group of the formula (1) and the aromatic radical is preferably an even number, where one or more non-adjacent C atoms may be replaced by $-O-$, $-S-$ or $-NR^1-$ and one or more C atoms may be substituted by a radical $R^1$ or halogen;

and with the proviso that the molecular weight of the hole-blocking material B is greater than 150 g/mol.

For the purposes of this invention, an aromatic or heteroaromatic ring system is taken to mean a system which does not necessarily comprise only aromatic or heteroaromatic groups, but instead in which a plurality of aromatic or heteroaromatic groups may also be interrupted by a short, non-aromatic unit, such as, for example, an $sp^3$-hybridised C, N or O atom. Thus, for example, systems such as 9,9'-spirobifluorene, 9,9-diarylfluorene, triarylamine, diaryl ether, etc., should also be taken to mean aromatic ring systems for the purposes of this application.

Very particular preference is given to an organic electroluminescent device which is characterised in that Y=C, P or S, and X=O.

It may also be preferred for the hole-blocking material B to contain more than one unit Y=X or more than one unit of the formulae (1) to (4).

The hole-blocking layer preferably comprises at least 50% of the hole-blocking material B, particularly preferably at least 80%, very particularly preferably consists only of the hole-blocking material B.

Preferred hole-blocking materials B have proven to be compounds which carry an aromatic or heteroaromatic group bonded directly to Y in at least one of the radicals $R^1$, $R^2$ and $R^3$. Particular preference is given to compounds which carry aromatic or heteroaromatic groups bonded directly to Y in all the radicals $R^1$, $R^2$ and $R^3$ present.

Particularly suitable hole-blocking materials B have proven to be compounds which do not have a planar structure. Corresponding substituents on the structural unit of the form Y=X may ensure a deviation of the overall structure from planarity. This is the case, in particular, if at least one of the substituents $R^1$, $R^2$, $R^3$ and/or $R^4$ contains at least one $sp^3$-hybridised carbon, silicon, germanium and/or nitrogen atom which consequently has approximately tetrahedral or, in the case of nitrogen, pyramidal bonding geometry.

In order to achieve a significant deviation from planarity, it is preferred for at least one of the $sp^3$-hybridised atoms to be a secondary, tertiary or quaternary atom, particularly preferably a tertiary or quaternary atom, in the case of carbon, silicon or germanium very particularly preferably a quaternary atom.

A secondary, tertiary or quaternary atom is taken to mean an atom having two, three or four substituents other than hydrogen.

Preference is given to compounds which contain a 9,9'-spirobifluorene derivative, preferably linked via the 2-and/or 2,7-and/or 2,2'-and/or 2,2',7-and/or 2,2',7,7'-position, a 9,9-disubstituted fluorene derivative, preferably linked via the 2-and/or 2,7-position, a 6,6-and/or 12,12-di-or tetrasubstituted cis-or trans-indenofluorene derivative, a triptycene derivative, preferably linked via the 9-and/or 10-position, a dihydrophenanthrene derivative, preferably linked via the 2-and/or 2,7-position, a hexaarylbenzene derivative, preferably linked via the p-position on the aromatic ring(s), or a tetraarylmethane derivative, preferably linked via the p-position on the aromatic ring(s), in at least one of the radicals R.

Particular preference is given to compounds which contain a 9,9'-spirobifluorene derivative or a 9,9-disubstituted fluorene derivative, very particularly preferably a 9,9'-spirobifluorene derivative, in at least one of the radicals $R^1$, $R^2$, $R^3$ or $R^4$.

The present invention furthermore relates to the use of compounds of the chemical structural unit of the formula Y=X, where X has at least one non-bonding electron pair and where the radical X stands for NR, O, S, Se or Te and R stands for an organic radical having 1 to 22 carbon atoms or for OH, OR, $NH_2$, $NHR^6$ or $N(R^6)_2$, where $R^6$=H or an organic radical having 1 to 20 C atoms, and where the radical Y stands for C, P, As, Sb, Bi, S, Se or Te, as hole-blocking material in an organic light-emitting diode.

Preference is given to an organic electroluminescent device which is characterised in that the matrix materials A are selected from the classes of carbazoles, for example in accordance with WO 00/057676, EP 01202358 and WO 02/074015, ketones and imines, for example in accordance with WO 04/093207, phosphine oxides, phosphine sulfides, phosphine selenides, phosphazenes, sulfones, sulfoxides, for example in accordance with DE 10330761.3, silanes, polypodal metal complexes, for example in accordance with WO 04/081017, and oligophenylenes based on spirobifluorenes, for example in accordance with EP 676461 and WO 99/40051. Particular preference is given to ketones, phosphine oxides and sulfoxides.

However, this selection is not crucial for the subject-matter of the invention. For example, further known materials, such as derivatives of carbazole, can also be used.

The OLED described above may also comprise further layers, such as, for example, a hole-injection layer, hole-transport layer, electron-injection layer and/or electron-transport layer. However, it should be pointed out that all these layers do not necessarily have to be present. Thus, it has been found that OLEDs according to the invention which comprise a hole-blocking layer consisting of a hole-blocking material B continue to give comparably good efficiencies and lifetimes at lower operating voltage if no electron-injection and electron-transport layers are used.

Preference is therefore given to organic electroluminescent devices in which the hole-blocking layer is directly adjacent to the electron-injection layer or cathode.

Preference is furthermore given to an organic electroluminescent device which is characterised in that the phosphorescent emitter present is a compound which contains at least one atom having an atomic number of greater than 36 and less than 84.

Particular preference is given to an organic electroluminescent device which is characterised in that the phosphorescent emitter contains at least one element having an atomic number of greater than 56 and less than 80, very particularly preferably molybdenum, tungsten, rhenium, ruthenium, osmium, rhodium, iridium, palladium, platinum, silver, gold and/or europium, for example in accordance with WO 98/01011, US 02/0034656, US 03/0022019, WO 00/70655, WO 01/41512, WO 02/02714, WO 02/15645, EP 1191613, EP 1191612, EP 1191614, WO 03/040257, WO 03/084972 and WO 04/026886.

Preference is furthermore given to an organic electroluminescent device which is characterised in that the glass transition temperature $T_g$ of the hole-blocking material B is greater than 100° C., preferably greater than 120° C., very particularly preferably greater than 140° C.

Preference is furthermore given to an organic electroluminescent device which is characterised in that one or more layers are coated by a sublimation process, in which the low-molecular-weight materials are vapour-deposited in vacuum sublimation units at a pressure below $10^{-5}$ mbar, preferably below $10^{-6}$ mbar, particularly preferably below $10^{-7}$ mbar.

Preference is likewise given to an organic electroluminescent device which is characterised in that one or more layers are coated by the OVPD (organic vapour phase deposition) process or with the aid of carrier-gas sublimation, which are known to the person skilled in the art and in which the low-molecular-weight materials are applied at a pressure between $10^{-5}$ mbar and 1 bar.

Preference is furthermore given to an organic electroluminescent device which is characterised in that one or more layers are coated by any desired printing process, such as, for example, flexographic printing or offset printing, particularly preferably LITI (light induced thermal imaging, thermal transfer printing) or ink-jet printing.

The emitting devices described above have the following surprising advantages over the prior art:

1. The efficiency of corresponding devices is increased compared with systems which do not follow the design according to the invention.
2. The stability and thus the lifetime of corresponding devices is increased compared with systems which do not follow the design according to the invention.
3. The operating voltages are significantly reduced and consequently the power efficiency is increased. This applies, in particular, if a separate electron-transport layer is not used.
4. The layer structure is simpler since it is possible to use at least one organic layer, namely the electron-transport layer, less, which results in lower production complexity. This is a considerable advantage in the production process since in the conventional production process, a separate vapour-deposition unit is generally used for each organic layer, and consequently at least one such unit is thus saved or omitted entirely.

The present application text and also the further examples below are directed only to organic light-emitting diodes and the corresponding displays. In spite of this restriction of the description, it is possible for the person skilled in the art, without further inventive step, also to use the corresponding design according to the invention for other, related devices, for example for organic solar cells (O-SCs), organic field-effect transistors (O-FETs) or also organic laser diodes (O-lasers), to mention but a few further applications. The present invention likewise relates to these.

EXAMPLES

Production and Characterisation of Organic Electroluminescent Devices Which Correspond to the Structure According to the Invention.

The OLEDs were produced by the general process outlined below. This was adapted in individual cases to the particular circumstances (for example layer-thickness variation in order to achieve optimum efficiency or colour). Electroluminescent devices according to the invention can be produced as described for example, in DE10330761.3.

The results for various OLEDs are presented in the following examples. The basic structure, such as the materials and layer thicknesses used, apart from the EML and HBL, were identical for better comparability. Emitting OLEDs having the following structure were produced analogously to the above-mentioned general process:

| | |
|---|---|
| PEDOT (HIL) | 60 nm (spin-coated from water; PEDOT purchased from H.C. Starck; poly-[3,4-ethylenedioxy-2,5-thiophene]) |
| NaphDATA (HTM) | 20 nm (vapour-deposited; NaphDATA purchased from SynTec; 4,4',4"-tris(N-1-naphthyl-N-phenylamino)triphenyl-amine |
| S-TAD (HTM) | 20 nm (vapour-deposited; S-TAD prepared as described in WO 99/12888; 2,2',7,7'-tetrakis(diphenylamino)spirobifluorene) |
| Emitter layer (EML) | 30 nm (precise structure: see examples in Table 1) |
| Hole-blocking layer (HBL) | 10 nm (see examples in Table 1) |
| AlQ$_3$ (ETL) | 20 nm (vapour-deposited: AlQ$_3$ purchased from SynTec; tris(quinolinato)aluminium(III)); not used in all examples |
| Ba/Al (cathode) | 3 nm Ba, 150 nm Al on top |

These as yet unoptimised OLEDs were characterised by standard methods; for this purpose, the electroluminescence spectra, the efficiency (measured in cd/A), the power efficiency (measured in lm/W) as a function of the brightness, calculated from current/voltage/brightness characteristic lines (IUL characteristic lines), and the lifetime were determined. The lifetime is taken to mean the time after which the initial brightness of the OLED has dropped to half at a constant current density of 10 mA/cm$^2$. Table 1 shows the results for various examples. The composition of the EML and HBL, including the corresponding layer thicknesses, is shown. The doped phosphorescent EMLs comprise as matrix material A1 the compound bis(9,9'-spirobifluoren-2-yl) ketone (syn-thesised as described in WO 04/093207), as matrix material A2 the compound bis(9,9'-spirobifluoren-2-yl)phenylphosphine oxide (synthesised as described in DE 10330761.3), as matrix material A3 2,7-bis(2-spiro-9,9'-bifluorenylcarbonyl)spiro-9,9'-bifluorene (synthesised as described in WO 04/093207) or as matrix material A4 CBP (4,4'-bis(N-carbazolyl)-biphenyl), as emitter the compounds Ir(PPy)$_3$ or Ir(piq)$_3$ (both synthesised as described in WO 02/060910), and as hole-blocking material B1 the compound bis(9,9'-spirobifluoren-2-yl) ketone, as hole-blocking material B2 the compound bis(9,9'-spirobifluoren-2-yl)phenylphosphine oxide, or as hole-blocking material B3 the compound 2,7-bis(2-spiro-9,9'-bifluorenylcarbonyl)spiro-9,9'-bifluorene. OLEDs which comprise B-Alq as hole-blocking material serve as comparative examples. The figure below shows the corresponding structural formulae of the substances used.

TABLE 1

| Experiment | EML | HBL | ETL | Max. efficiency (cd/A) | Max. power efficiency (lm/W) | Voltage (V) at 100 cd/m$^2$ | Lifetime (h) at 10 mA/cm$^2$ |
|---|---|---|---|---|---|---|---|
| Example 1 a | A2: 10% IrPPy | B1 | AlQ$_3$ | 29.1 | 16.5 | 4.7 | 630 |
| Example 1 b (comparison) | A2: 10% IrPPy | BAlq | AlQ$_3$ | 25.2 | 14.8 | 5.7 | 510 |
| Example 2 a | A2: 10% IrPPy | B1 | — | 30.2 | 19.1 | 3.5 | 710 |
| Example 2 b (comparison) | A2: 10% IrPPy | BAlq | — | 24.8 | 14.7 | 5.2 | 240 |
| Example 3 | A3: 10% Ir(piq)$_3$ | B1 | AlQ$_3$ | 7.3 | 7.1 | 4.9 | about 23000 (extrapolated) |
| Example 4 a | A3: 10% Ir(piq)$_3$ | B1 | — | 7.5 | 8.1 | 4.5 | about 18000 (extrapolated) |
| Example 4 b (comparison) | A3: 10% Ir(piq)$_3$ | BAlq | — | 6.6 | 5.4 | 5.5 | about 2600 (extrapolated) |
| Example 5 | A1: 10% IrPPy | B2 | AlQ$_3$ | 34.0 | 26.9 | 4.1 | 590 |
| Example 6 | A1: 10% IrPPy | B2 | — | 32.7 | 27.7 | 3.5 | 490 |
| Example 7 a | CBP: 10% IrPPy | B2 | AlQ$_3$ | 29.7 | 17.2 | 4.5 | 650 |
| Example 7 b (comparison) | CBP: 10% IrPPy | BAlq | AlQ$_3$ | 18.3 | 8.5 | 5.1 | 250 |
| Example 8 a | CBP: 10% IrPPy | B2 | — | 27.2 | 15.9 | 5.1 | 330 |
| Example 8 b (comparison) | CBP: 10% IrPPy | BAlq | — | 16.5 | 8.8 | 5.3 | 180 |
| Example 9 | A1: 10% IrPPy | B3 | AlQ$_3$ | 30.5 | 25.0 | 4.8 | 450 |
| Example 10 | A1: 10% Ir(piq)$_3$ | B3 | AlQ$_3$ | 6.5 | 6.4 | 5.1 | about 25000 (extrapolated) |
| Example 11 a | A1: 10% Ir(piq)$_3$ | B3 | — | 7.5 | 8.1 | 4.5 | about 20000 (extrapolated) |
| Example 11 b (comparison) | A1: 10% Ir(piq)$_3$ | BAlq | — | 6.1 | 5.2 | 5.6 | about 5000 (extrapolated) |

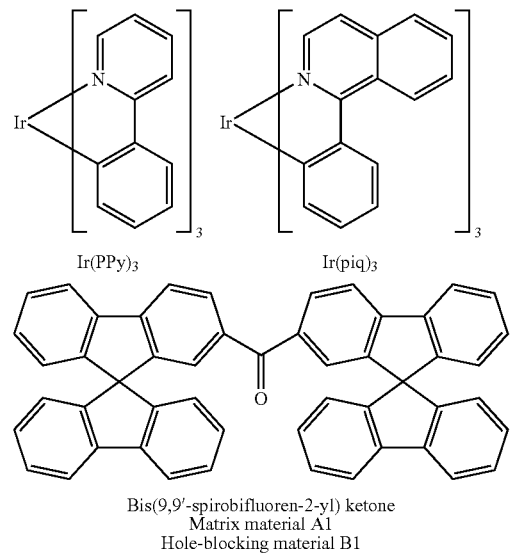

Ir(PPy)$_3$  Ir(piq)$_3$

Bis(9,9'-spirobifluoren-2-yl) ketone
Matrix material A1
Hole-blocking material B1

| Experiment | EML | HBL | ETL | Max. efficiency (cd/A) | Max. power efficiency (lm/W) | Voltage (V) at 100 cd/m² | Lifetime (h) at 10 mA/cm² |
|---|---|---|---|---|---|---|---|

Bis(9,9'-spirobifluoren-2-yl)phenylphosphine oxide
Matrix material A2
Hole-blocking material B2

2,7-Bis(2-spiro-9,9'-spirobifluorenylcarbonyl)spiro-9,9'-bifluorene
Matrix material A3
Hole-blocking material B3

CBP
Matrix material A4

BAlq

The OLEDs exhibit green emission from the dopant Ir(PPy)₃ and red emission from the dopant Ir(piq)₃.

In all examples, a significant improvement in the efficiency and lifetime with reduced operating voltage is evident compared with devices in accordance with the prior art which comprise B-Alq as hole-blocking material.

A similar trend is also evident if a separate ETL is not used. In the OLEDs in accordance with the prior art, the photometric efficiency decreases and the lifetime is significantly shortened compared with OLEDs comprising an ETL. This is not the case in the OLEDs manufactured in accordance with the novel design principle, where, in particular, the voltages drop, causing an improvement in the power efficiency.

In summary, it can be stated that OLEDs manufactured in accordance with the novel design principle have higher efficiency at lower voltage and longer lifetime, as can easily be seen from Table 1.

The invention claimed is:

1. Organic electroluminescent device comprising anode, cathode and at least one emission layer comprising at least one matrix material A which is doped with at least one phosphorescent emitter, and at least one hole-blocking layer comprising at least one hole-blocking material B, with the proviso that the matrix material A is not identical with the hole-blocking material B, wherein the hole blocking material B conforms to the formulae (1) to (4) according to scheme 1

Scheme 1

Formula (1)

-continued

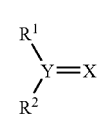
Formula (2)

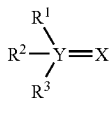
Formula (3)

Formula (4)

wherein

Y is, identically or differently on each occurrence, C or S in the formula (2) and P in the formulae (1) and (3) and S in the formulae (4);

X is on each occurrence, identically or differently, O or S and in formula (3) is S;

$R^1$, $R^2$ and $R^3$ is, identically or differently on each occurrence, H, F, CN, $N(R^4)_2$, a straight-chain, branched or cyclic alkyl, alkoxy or thioalkoxy group having 1 to 40 C atoms, which may be substituted by $R^5$ or also unsubstituted, in which one or more non-adjacent $CH_2$ groups may be replaced by $-R^6C=CR^6-$, $-C\equiv C-$, Si $(R^6)_2$, C=O, C=S, C=Se, $C=NR^6$, $-O-$, $-S-$, $-NR^6-$ or $-CONR^6-$ and in which one or more H atoms may be replaced by F, Cl, Br, I, CN or $NO_2$, or an aromatic or heteroaromatic ring system or an aryloxy or heteroaryloxy group having 1 to 40 aromatic C atoms, which may be substituted by one or more radicals $R^5$; a plurality of substituents $R^1$, $R^2$ and/or $R^3$ here may form a mono- or polycyclic, aliphatic or aromatic ring system with one another; or an aromatic or heteroaromatic ring system bonded via a divalent group $-Z-$, or an aryloxy or heteroaryloxy group, each having 1 to 40 aromatic C atoms, in which one or more H atoms may be replaced by F, Cl, Br or I or which may be substituted by one or more non-aromatic radicals $R^4$, where a plurality of substituents $R^4$ may define a further mono- or polycyclic, aliphatic or aromatic ring system;

$R^4$ is on each occurrence, identically or differently, a straight-chain, branched or cyclic alkyl or alkoxy chain having 1 to 22 C atoms, in which, in addition, one or more non-adjacent C atoms may be replaced by $-R^6C=CR^6-$, $-C\equiv C-$, $Si(R^6)_2$, $-NR^6-$, $-O-$, $-S-$, $-CO-O-$ or $-O-CO-O-$ and in which one or more H atoms may be replaced by fluorine, an aryl, heteroaryl or aryloxy group having 1 to 40 C atoms, which may also be substituted by one or more radicals $R^6$, or OH or $N(R^5)_2$;

$R^5$ is on each occurrence, identically or differently, $R^4$ or CN, $B(R^6)_2$ or $Si(R^6)_3$;

$R^6$ is on each occurrence, identically or differently, H or an aliphatic or aromatic hydrocarbon radical having 1 to 20 C atoms;

Z is a straight-chain, branched or cyclic, preferably conjugated radical having 1 to 40 C atoms, which is preferably conjugated with the two other substituents, where the number of atoms of Z which link the group of the formula (1) and the aromatic radical is preferably an even number, where one or more non-adjacent C atoms may be replaced by $-O-$, $-S-$ or $-NR^1-$ and one or more C atoms may be substituted by a radical $R^1$ or halogen;

and with the proviso that the molecular weight of the hole-blocking material B is greater than 150 g/mol.

2. Organic electroluminescent device according to claim 1, wherein Y=C, P or S, and X=O for formulas (1), (2) and (4).

3. Organic electroluminescent device according to claim 1, characterised in that the hole-blocking layer comprises at least 50% of the hole-blocking material B.

4. Organic electroluminescent device according to claim 3, characterised in that the hole-blocking layer consists only of the hole-blocking material B.

5. Organic electroluminescent device according to claim 1, characterised in that the compounds of the hole-blocking material B do not have a planar structure.

6. Organic electroluminescent device according to claim 1 characterised in that at least one of the substituents $R^1$ to $R^4$ in the hole-blocking material B contains at least one $sp^3$-hybridised carbon atom.

7. Organic electroluminescent device according to claim 6, characterised in that the $sp^3$-hybridised carbon atom is a secondary, tertiary or quaternary carbon atom.

8. Organic electroluminescent device according to claim 7, characterised in that the $sp^3$-hybridised carbon atom is a quaternary carbon atom.

9. Organic electroluminescent device according to claim 1, characterised in that a 9,9'-spirobifluorene derivative, a 9,9-disubstituted fluorene derivative, an indenofluorene derivative, a triptycene derivative, 9,10-dihydrophenanthrene derivative, a hexaarylbenzene derivative or a tetraarylmethane derivative is present in at least one of the radicals $R^1$ to $R^4$.

10. Organic electroluminescent device according to claim 1, characterised in that a 9,9'-spirobifluorene derivative or a 9,9-disubstituted fluorene is present in at least one of the radicals $R^1$ to $R^4$.

11. Organic electroluminescent device according to claim 1, characterised in that the matrix materials A are selected from the group of carbazoles, silanes, polypodal metal complexes, oligophenylenes based on spirobifluorenes, ketones, imines, phosphine oxides, phosphine sulfides, phosphine selenides, phosphazenes, sulfones and sulfoxides.

12. Organic electroluminescent device according to claim 1, characterised in that the hole-blocking layer is directly adjacent to the electron-injection layer or cathode.

13. Organic electroluminescent device according to claim 1, characterised in that the phosphorescent emitter present is a compound which contains at least one atom having an atomic number of greater than 36 and less than 84.

14. Organic electroluminescent device according to claim 13, characterised in that the phosphorescent emitter contains at least one atom having an atomic number of greater than 56 and less than 80.

15. Organic electroluminescent device according to claim 13, characterised in that the phosphorescent emitter contains molybdenum, tungsten, rhenium, ruthenium, osmium, rhodium, iridium, palladium, platinum, silver, gold and/or europium.

16. Organic electroluminescent device according to claim 1, characterised in that the glass transition temperature $T_g$ of the hole-blocking material B is greater than 100° C.

17. Organic electroluminescent device according to claim 1, characterised in that one or more layers are produced by a sublimation process.

18. Organic electroluminescent device according to claim 1, characterised in that one or more layers are applied by the OVPD (organic vapour phase deposition) process.

19. Organic electroluminescent device according to claim 1, characterised in that one or more layers are coated by a printing process.

20. Organic electroluminescent device according to claim 19, characterised in that one or more layers are coated by the ink-jet printing process.

21. Organic electroluminescent device according to claim 19, characterised in that one or more layers are coated by the LITI (light induced thermal imaging) process.

22. The organic electroluminescent device as claimed in claim 1, where $R^4$ stands for an organic radical having 1 to 22 carbon atoms and where the radical Y stands for C or P.

23. A hole-blocking material in an electronic component which comprises the device as claimed in claim 22.

24. An organic light-emitting diode, organic solar cell, organic field-effect transistor, organic thin-film transistor, organic integrated circuit or organic laser diode which comprises the hole-blocking material as claimed in claim 23.

25. An organic solar cell, an organic field-effect transistor, an organic thin-film transistor, an organic integrated circuit or an organic laser diode which comprises the organic electroluminescent device according to claim 1.

* * * * *